United States Patent
Kopp et al.

(10) Patent No.: US 7,846,770 B2
(45) Date of Patent: Dec. 7, 2010

(54) METHOD FOR COATING TWO ELEMENTS HYBRIDIZED BY MEANS OF A SOLDERING MATERIAL

(75) Inventors: Christophe Kopp, Fontanil Cornillon (FR); Jacqueline Bablet, Le Gua (FR); Jacques Raby, Grenoble (FR); Cyrille Rossat, Saint Etienne de Saint Geoirs (FR)

(73) Assignees: Commissariat a l'Energie Atomique, Paris (FR); Photonera France, L'Union (FR)

( * ) Notice: Subject to any disclaimer, the term of this patent is extended or adjusted under 35 U.S.C. 154(b) by 0 days.

(21) Appl. No.: 12/652,769

(22) Filed: Jan. 6, 2010

(65) Prior Publication Data

US 2010/0102107 A1   Apr. 29, 2010

Related U.S. Application Data

(63) Continuation of application No. PCT/FR2008/051352, filed on Jul. 17, 2008.

(30) Foreign Application Priority Data

Jul. 23, 2007  (FR) .................................... 07 05330

(51) Int. Cl.
  *H01L 21/48* (2006.01)
  *H01L 21/50* (2006.01)
(52) U.S. Cl. ...................................... 438/108; 438/127
(58) Field of Classification Search .................. None
  See application file for complete search history.

(56) References Cited

U.S. PATENT DOCUMENTS

| | | | |
|---|---|---|---|
| 5,496,769 A | 3/1996 | Marion et al. | |
| 5,737,191 A * | 4/1998 | Horiuchi et al. | 361/764 |
| 6,228,679 B1 * | 5/2001 | Chiu | 438/108 |
| 6,391,683 B1 * | 5/2002 | Chiu et al. | 438/108 |
| 6,459,144 B1 * | 10/2002 | Pu et al. | 257/667 |
| 7,148,560 B2 * | 12/2006 | Lee et al. | 257/667 |
| 2004/0005732 A1 | 1/2004 | Hiatt et al. | |
| 2004/0121512 A1 | 6/2004 | Manepalli et al. | |
| 2005/0127533 A1 * | 6/2005 | Odegard et al. | 257/787 |
| 2007/0099346 A1 | 5/2007 | Farooq et al. | |

FOREIGN PATENT DOCUMENTS

FR   2 704 691 A1   11/1994

* cited by examiner

*Primary Examiner*—Scott B Geyer
(74) *Attorney, Agent, or Firm*—Burr & Brown

(57) ABSTRACT

The method of coating the area of hybridization of a component that is constituted by two elements bonded to one another by means of a soldering material, including depositing proximate to the component a coating substance capable of filling by capillarity action the volume defined between the hybridized elements of the component. Further, along the periphery of the hybridization area on the lower element of the component is an area of non-wettability in regards to the coating substance, that is defined by depositing an anti-wetting covering of PECVD in regards to the coating substance, whereby the anti-wetting covering on the first element encompasses the hybridization area and surrounds a wetting surface for the coating substance.

9 Claims, 4 Drawing Sheets

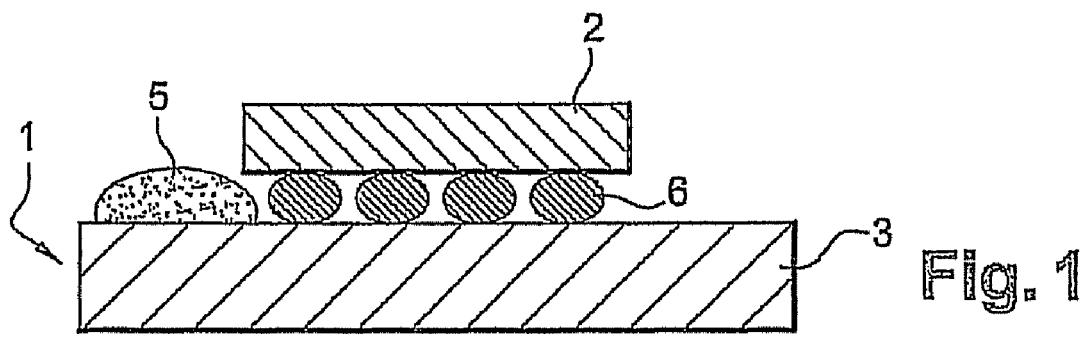
PRIOR ART
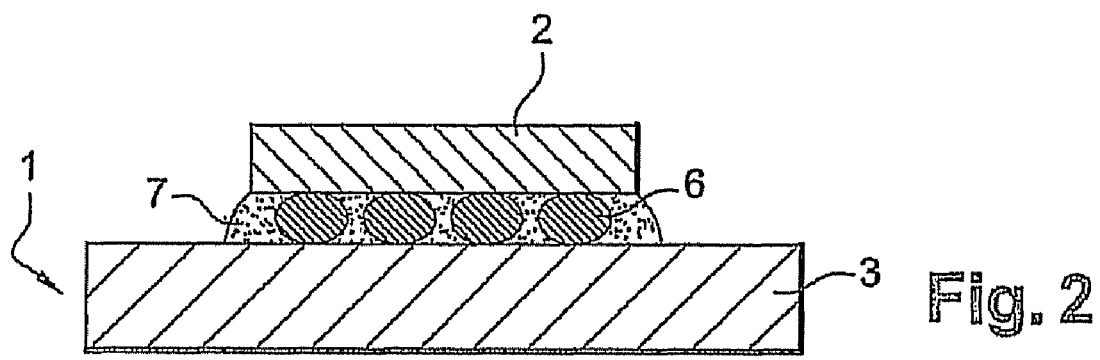
PRIOR ART

METHOD FOR COATING TWO ELEMENTS HYBRIDIZED BY MEANS OF A SOLDERING MATERIAL

FIELD OF THE INVENTION

The present invention relates to the microelectronics field, and to be more specific to that of techniques of hybridization by means of bumps of two heterogeneous components, also known as soldering bumps. It is connected therefore to the general field of micro-components, more conventionally denoted electronic chips, but also capable of being applied to micro-sensors, micro-actuators, such as Micro Electro Mechanical Systems (MEMS), and also to optoelectronic components, such as Vertical Cavity Semi Conductor Emitting Lasers (VCSEL).

Under the invention, the temu component is taken to mean an electronic sensor, such as an electronic chip, an electrical or electronic circuit support, or a passive electrical component such as a protective cover, or even a physical quantity sensor.

BACKGROUND OF THE INVENTION

The micro-components concerned in the context of the present invention are conventionally deposited on a substrate of an appropriate type, for example the semi-conductor type (single crystal silicon, sapphire, etc.) for electronic components.

The substrate is provided with electrically conductive tracks, that are made out of aluminium for example, which radiate from the micro-component towards the periphery of the substrate, in order to make it possible, not only to supply to the component any electrical power that might be required, but also and above all to process the operation of the signals that the component is called upon to generate, while even controlling the functions it incorporates.

To join different components to each other, one of the techniques in widespread use today is that of flip-chip hybridization by means of solder welding balls or bumps. This technology includes in brief:

depositing onto one or more wettable surfaces, placed on one of the components for joining, the material constituting the welding bumps in an appropriate quantity;

providing the other component for hybridizing with surfaces that are wettable by the welding material, with the surfaces being provided substantially in line with the surfaces of the first component when the second component is transferred onto the first;

depositing a flow of material in liquid form, the flow performing a chemical function of deoxidation and prevention of reoxidation during soldering, a thermal function enabling the transfer of heat, and a physical function enabling surface tensions to be reduced and thereby promoting the formation of the bumps themselves;

then, bringing the wettability surface of the second component into contact with the soldering material so deposited;

and finally, raising the temperature until a temperature is reached higher than the fusion temperature of the material constituting the bumps in order to obtain the fusion thereof until the required result is achieved, namely the hybridization of the first component to the second component, with bumps creating a mechanical and/or electrical link between the wettable surfaces of each of the components, with at least the wettable surfaces being themselves connected to the conductive tracks provided thereon.

Thus, during the assembly process, the soldering material constituting the bumps takes on the shape of a ball.

Because of the great number of components capable of being hybridized on a single substrate surface, particular care must be paid to the problem of the mechanical strength of the circuits produced. In order to optimize the mechanical strength, there is a known technique of coating the electronic components obtained after hybridization.

A prior art coating technique has in fact been shown in relation to FIGS. 1 and 2.

This coating method may include depositing a calibrated drop 5 of coating substance, such as a coating resin, onto the substrate 3 or read circuit of a component 1, in proximity to the hybridization region of a chip 2 to the substrate.

The calibrated drop 5 of resin is deposited near to the electronic component hybridized by the bumps with the drop of resin migrating by capillarity action under the electronic component or chip 2 added by hybridization. In other words, the resin will occupy the volume defined between the electronic component and the substrate and come to surround the hybridization bumps 6. The coating 7 guarantees the mechanical strength over time of the component so obtained after hybridization.

The coating technique, however, does encounter a certain number of difficulties.

In the first place, in order to implement the capillarity effect while ensuring the effective migration of the coating resin, the drop of resin must be deposited sufficiently close to the hybridized component in order to generate a surface tension effect by capillarity action.

In the same way, the volume of resin must be large enough to fill completely the space defined between the component 2 and the substrate 3. However, this quantity must not be excessive either, in order to prevent the resin from spreading beyond the substrate, which might, if this were to happen, prevent the hybridization of other components in adjacent proximity.

An improvement to this coating technique has been described, for example in the document FR 2 704 691. In brief, this includes the positioning a carpet of balls in proximity to the bumps intended to hybridize the component on the substrate, the coating resin being deposited onto the carpet of balls with the latter ensuring the migration of the resin by capillarity action towards the hybridized component, thereby resolving the problem inherent in the proximity in a straightforward way.

However, this improvement does not resolve the problem of controlling the spread of the coating resin beyond the hybridized component, where an excess of resin is always able to uncontrollably spread elsewhere on the substrate. To escape this difficulty, a proposal has also been made for the implementation of a seam of adhesive that is peripheral relative to the component with the seam acting as a barrier and the coating resin being deposited inside the seam.

However, this technique also comes up against various drawbacks among which is the fact that this method must be carried out in two stages, which is detrimental to the manufacturing time.

Moreover, implementing the seam consumes valuable surface area on the substrate, thereby reducing the capacity for bringing together and concentrating the necessary components on a single substrate.

The invention specifically sets out to find a solution for these different problems.

SUMMARY OF THE INVENTION

The invention thus applies, initially, to a method of coating the area of hybridization of a component constituted by two elements each associated with the other by means of a soldering material.

The method includes depositing a coating substance in close proximity to the component, also known as underfill resin in the technical field under consideration, which is capable of filling by capillarity action the volume defined between the hybridized elements of the component.

According to the invention, on the periphery of the hybridization area on the lower element of the component, an area of non-wettability in regards to the coating substance is defined by the deposition of a covering that is anti-wetting in regards to the substance, with the deposition being applied by Plasma Enhanced Chemical Vapour Deposition (PECVD).

In doing this, the non-wettability area provides a barrier relative to the coating substance, thereby avoiding any risk of dispersion of the coating substance over the lower element, and in general terms over the substrate on which the component is hybridized.

According to the invention, the anti-wetting covering, which is not very thick, is constituted for example by SiOC or $C_4F_8$.

According to one advantageous feature of the invention, a continuous surface is defined on the first element or substrate, in line with the hybridization area which is required to be coated, and intended to receive the coating substance.

The area with wetting in regards to the coating substance, is defined by the non-wetting area in regards the coating substance that is applied on or around the periphery thereof.

According to one feature of the invention, zone includes a first extension, located contiguous and in continuity with the wetting area, and intended to act as reception surface for the drop of coating substance.

According to another feature of the invention, the area also comprises a second extension, also contiguous and in continuity therewith, and intended to collect the excess coating substance, which is advantageously located opposite to the reception extension relative to the hybridized component that it is required to be coated.

In other words, in these two designs, the non-wettability area, which is peripheral to the hybridized component, has one or two extensions defining an area for receiving the coating substance and an area for collecting the excess coating substance respectively.

According to one particular feature of the invention, more specifically intended for optoelectronic components, a non-wettability surface relative to the coating substance is also defined on the first element or on the substrate on which the second element is hybridized, located in the hybridization area and in a particular area in which the presence of the coating substance is not required.

The design may be found in the context of optoelectronic components in respect of which it may be required to hybridize a laser, the substrate then being bored with a through orifice, to let the laser beam through or to receive an optical fibre.

According to another objective of the invention, the specified method can be used to convert wettability properties on the anti-wetting coating that is obtained. This wettability feature inversion is obtained, in compliance with the invention, by subjecting the anti-wetting covering to the action of a plasma or to the action of an ultra-violet radiation. To this end, after the elements constituting the component have been hybridized together and coated by the so-called "underfill" resin, in accordance with what has been described above, the assembly can then be coated with another resin, known in the field under consideration by the term "glob-top", which confers excellent mechanical cohesion on the component.

In other words, this reversibility of the wettability properties enables components previously hybridized by "flip chip" to be coated by a coating resin or "glob-top" with good adhesion, and with the electrical contacts under the chip or under the hybridized element that has been coated with an underfill resin in a controlled way by using deposition barriers that are hydrophobic, and therefore, not able to be bonded effectively. Indeed, on depositions left hydrophobic, a "glob-top" coating would have poor adhesion, promoting incipient cracking.

It will be useful to recall that the wettability is reduced when the hydrophobic character is increased.

BRIEF DESCRIPTION OF THE DRAWINGS

The way in which the invention can be implemented, and the resulting advantages, will become clearer from the following embodiment examples, given for information purposes and non-restrictively, supported by the appended figures.

FIGS. 1 and 2 are diagram representations of a prior art coating principle.

DETAILED DESCRIPTION OF THE INVENTION

Figure 3:
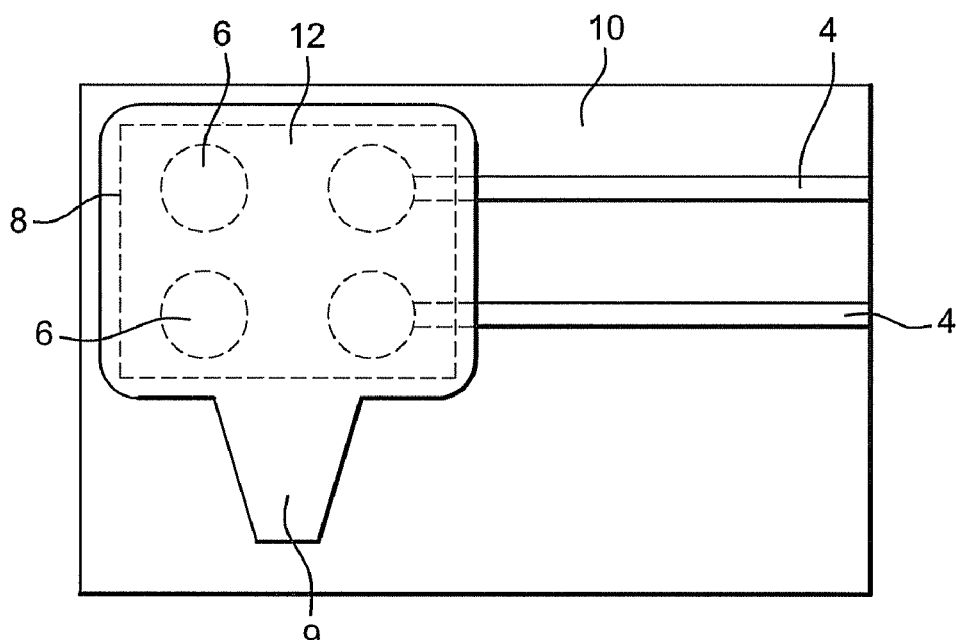
FIG. 3 is a view from above of the method of coating a hybridized component in accordance with the invention.
Figure 4:
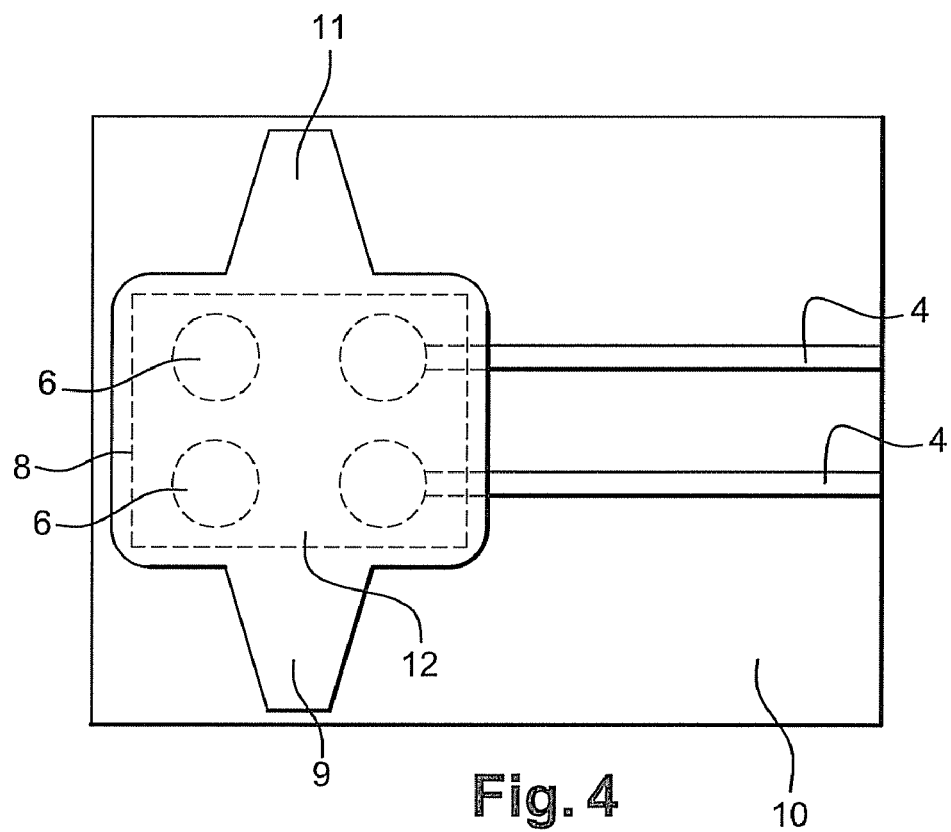
FIG. 4 is a view from above similar to FIG. 3 of an alternative embodiment.

A description is given, in relation to FIGS. 3 and 4, of a method of coating a component obtained after hybridization. This is based fundamentally on the principle of the migration of a coating resin or underfill resin 7 in the volume or space defined by the hybridized components 2 and 3, thereby ensuring the mechanical strength of the hybridized component and the resistance in particular of the microbumps 6 subsequent to the different stresses that may be encountered by the sensor implementing the hybridized component.

The coating resin may consist of epoxy, but may also be selected from the group that includes acrylates and silicones.

To confine the coating resin in the inter-component space, the lower component, in the case in point the substrate 3, is coated with a fine layer of material of non-wettability in regards to the coating substance, with the exception of the hybridization area.

A view from above is given in FIG. 3 of just the lower part of the component. The reference 4 shows conductive tracks, the reference 8 shows in broken lines the perimeter of the component and the reference 12 the area of confinement of the resin.

According to the invention, an area for the deposition 9 of the required quantity of coating resin is also defined, again by implementing the covering with non-wettability in regards to the coating resin. The confinement of the coating resin by the presence of the non-wettability covering for the whole periphery of the component, makes it certain that the coating resin will not migrate beyond the necessary surface, thereby allowing the prior art drawbacks to be overcome.

Because of the confinement of the coating resin, it becomes possible to increase the concentration of hybridized components on a single substrate since the problems related to the migration of the coating resin beyond the inter-component area are no longer encountered.

The covering with non-wettability in regards to the coating resin is not very thick, typically between 10 and 500 nm, and is constituted for example by SiOC or $C_4F_8$.

The covering is deposited by Plasma Enhanced Chemical Vapour Deposition (PECVD) from a precursor, Octamethylcyclotetrasiloxane (OMCTS) in the case in point and by using a carrier gas such as argon or hydrogen.

Depending on the power of the plasma, the pressure, the initial precursor concentration and the duration of the plasma deposition, the thickness of the deposited layer and the stoichiometry thereof. $SiO_{x1}C_{y1}H_{z1}$ can be controlled. The material $SiO_{x1}C_{y1}H_{z1}$ is of formulation such that $0.3 \leq x1 \leq 0.4$ and $0.15 \leq y1 \leq 0.2$ and $0.4 \leq z1 \leq 0.55$.

Quite clearly, the deposition method and corresponding treatments may be applied more generally to other types of siloxanes of a close formulation, such as for example tetraethylcyclotetrasiloxane (TNCTS).

The material may further be treated and transformed on the surface into a material with the general formulation $SiO_{x2}C_{y2}H_{z2}$, with $x_2 \gg x_1$, $y_2 \ll y_1$ and $z_2 \ll z_1$, or more straightforwardly $SiO_x$, in which x tends towards 2 in order to increase the value of its surface, while the polar energy induces a very strong wettability of liquids (contact angle of about 5° in respect of water), and a marked increase in adhesion and cellular development (moving from a generation time of 40 hours in respect of crude OMCTS to 20 hours in respect of the treated OMCTS).

The treatments used are either of the plasma type, namely helium plasma or oxygen plasmas $O_2$, $SF_6+O_2$, $CHF_3+O_2$ etc.), or of the UV type in ambient air or in an oxygen-enriched atmosphere.

The treatments in respect to this type of deposition therefore have the particular advantage of making wettable in regards to a substance an area that was initially non-wettable in regards to the substance. In other words, the initial low wettability or non-wettability property of the deposition becomes reversible.

This feature can advantageously be implemented in order to improve the adhesion of the covering resins, also known as "glop-top" in the technical field under consideration, to promote and optimize the mechanical cohesion of the component obtained after hybridization.

Figure 8A:
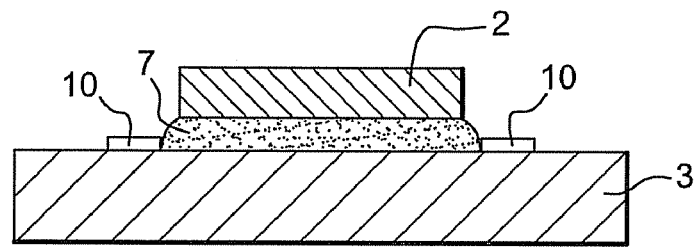
FIGS. 8a, 8b and 8c set out to show the reversible character of the wettability properties of the coating applied in accordance with the invention.
Figure 8B:
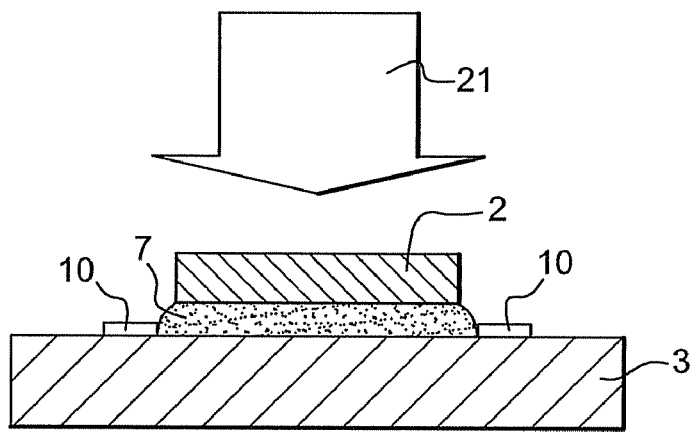
Figure 8C:
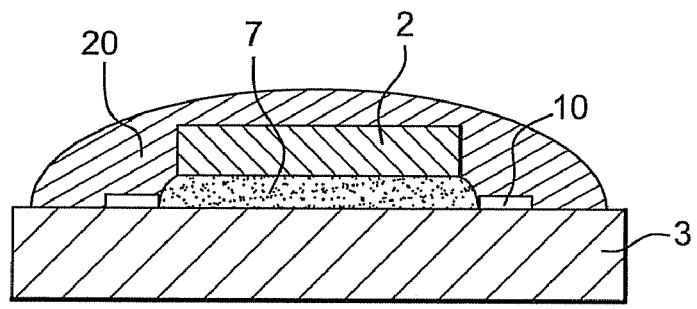

Thus, initially (FIG. 8a), the deposition of the localized anti-wetting coating 10, and for example $SiO_{x1}C_{y1}H_{z1}$ controls by confinement the spread of the coating or underfill resin 5, 7 under the component or hybridized element 2, then in a second phase, the unit so obtained is subjected to the action of a plasma or ultra-violet radiation 21 (FIG. 8b), tending to make the confinement covering wettable in regards to a covering or a coating or a "glob-top" resin 20, thereby improving its properties of adhesion with the resin, in order to promote an effective and durable coating of the component after hybridization (FIG. 8c), while preventing the incipient cracking that is frequently observed on components obtained by conventional "flip chip" hybridization and coating. The coating resin may be of the same type as the underfill resin, and for example, epoxy, silicones, acrylates etc.

The inventive method therefore also offers the possibility of easy localization by treating, using either mechanical masks or optical masks, areas of strong surface energy. This action means that droplets of various chemical species, from relatively non viscous liquids (water, biological molecules, oil) to viscous liquids (gum, resin, paint) can be localized on a pattern determined by the mask, and on the other hand, the adhesion of living cells (and the adsorption of biological molecules) can be localized in the areas.

According to an alternative of the invention shown in FIG. 4, the area of non-wettability 10 is modified by defining an additional surface 11, in the case in point opposite to the surface 9, and intended to collect any excess coating resin.

The method may be advantageously implemented in respect to particular components and in particular to prevent the deposition or migration of the coating resin under the chip 2, and generally speaking under the active component.

Figure 5:
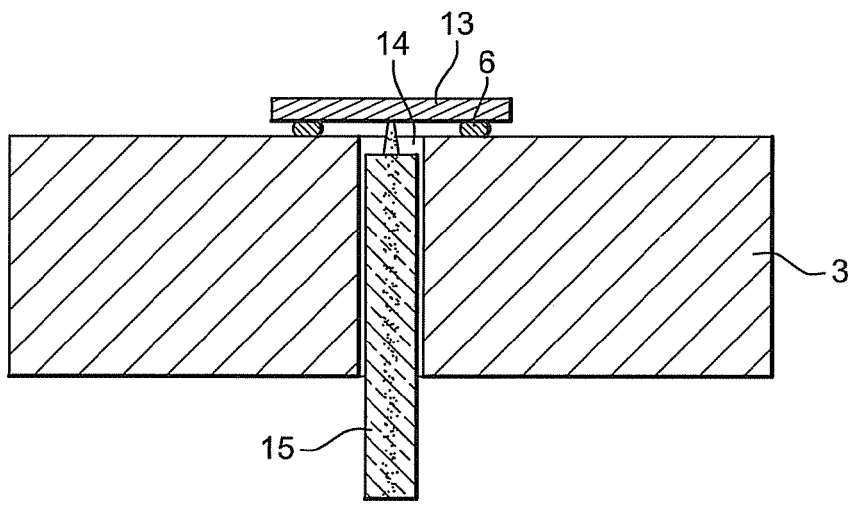
FIG. 5 shows the implementation of a coated hybridized optoelectronics component in accordance with the inventive method seen in cross-section, FIG. 6 being a view from above.
Figure 6:
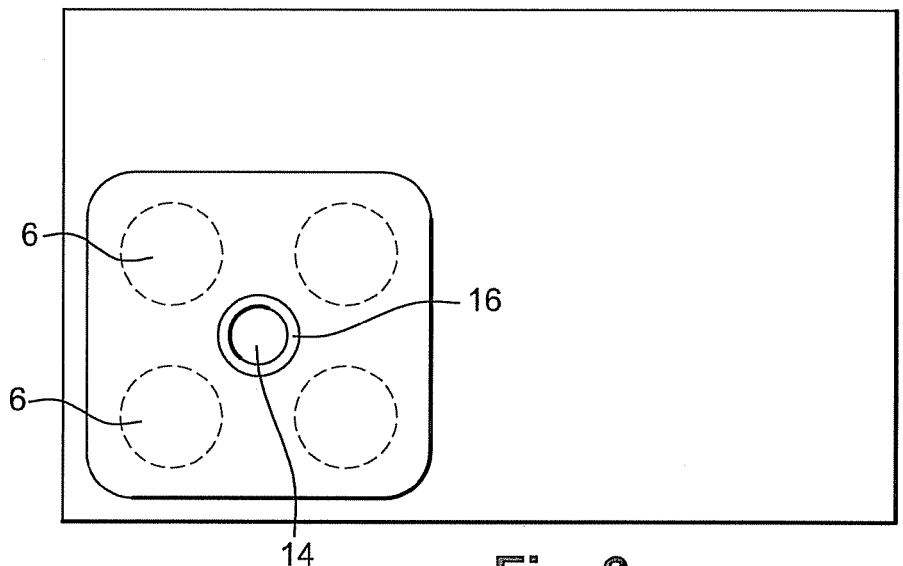

An optoelectronic component has thus been shown in relation to FIGS. 5 and 6, wherein a laser 13 is hybridized on a substrate 3. The latter is bored with a through orifice 14, intended to let the laser beam through or to receive an optical fibre 15. Quite clearly, in the context of a VCSEL of this kind, the area of the chip located in line with the orifice 14 must be free from coating resin. To this end, on the periphery of the through orifice 14 is deposited a ring 16 of a material of non-wettability in regards to the coating resin.

Figure 7:
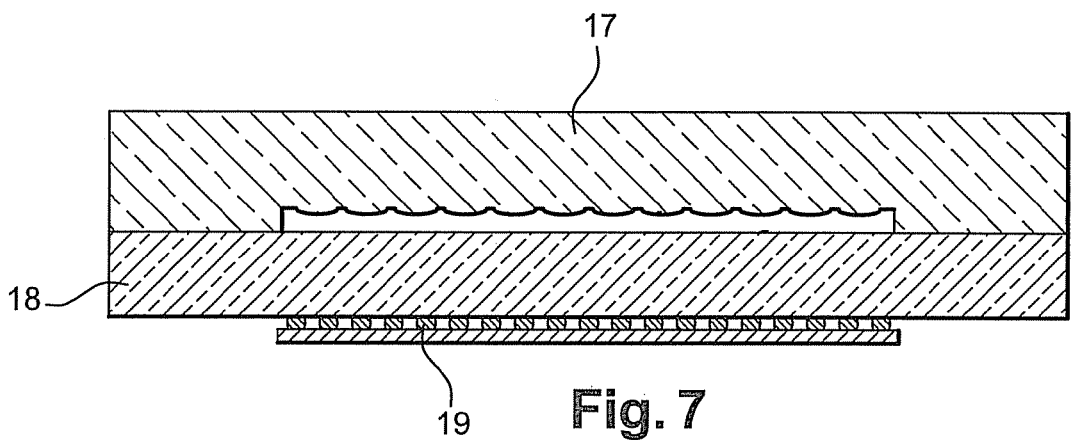
FIG. 7 is a diagrammatic representation of a hybridized component in accordance with the invention, and implementing a linear laser array and a linear lens array in the context of an optronics component.

Another particular component implementing the coating method has also been shown in relation to FIG. 7. In this case, it is required that the adhesive securing the linear lens array 17 to a transparent substrate 18 must not disturb the optical function of the lenses 17 and must not affect the optical path of the laser beams coming from a linear laser array 19, hybridized on the opposite face of the transparent substrate 18. To prevent the adhesive from migrating and spreading over the optical paths, an anti-wetting covering is deposited, for example in the form of a peripheral seam as in the previously described example.

The full advantage of the invention can now be seen, in simplifying the means employed in coating the component hybridization area in order to guarantee the mechanical strength thereof.

The invention claimed is:

1. A method of coating an area of hybridization of a component formed by two elements, a first lower element and a second upper element, bonded to one another by means of a soldering material, respectively, comprising the steps of:
    depositing a coating substance capable of filling by capillary action the volume existing between the hybridized elements of said component within a periphery of the hybridization area on said first lower element of said component that is defined by an area of non-wettability in regards to said coating substance,
    wherein the non-wettability area is produced by a deposition of a covering that is anti-wetting in regards to said coating substance and obtained by PECVD, and
    wherein the non-wettability area defined on said first lower element encompasses the hybridization area and forms a confined wetting surface for said coating substance.

2. The hybridization area coating method according to claim 1, wherein the anti-wetting covering is constituted by SiOC or $C_4F_8$.

3. The hybridization area coating method according to claim 1, wherein the area of non-wettability in regards to said coating substance is defined by a surface contiguous and in continuity with the wetting surface and intended to receive the deposition of said coating substance.

4. The hybridization area coating method according to claim 1, wherein the area of non-wettability in regards to said coating substance is defined by a surface contiguous and in continuity with the wetting surface and intended to collect any excess coating substance.

5. The hybridization area coating method according to claim 4, wherein the collecting surface of said excess coating substance is located opposite to the deposition surface of said coating substance relative to the hybridized component.

6. The hybridization area coating method according to claim 1, wherein a surface of non-wettability in regards to said coating substance is also defined on said first lower element, located in the hybridization area and in an area in which the presence of the coating substance is not required, said non-wettability surface also being obtained by deposition of a covering that is anti-wetting in regards to said coating substance.

7. A hybridization area coating method according to claim 1, wherein wettability properties of the anti-wetting covering are treated and transformed after the migration of said coating substance between the hybridized elements, wherein the coated hybridization area component is subjected to an action of a plasma or an ultra-violet radiation, and wherein the wettability properties of the anti-wetting covering are reversed.

8. The hybridization area coating method according to claim 7, wherein after the plasma or ultra-violet radiation treatment is completed, the component so obtained is coated with a coating resin.

9. The hybridization area coating method according to claim 1, wherein the anti-wetting covering is constituted by $SiO_{x1}C_{y1}H_{z1}$, wherein:

$0.3 \leq x1 \leq 0.4$ $0.15 \leq y1 \leq 0.2$ and $0.4 \leq z1 \leq 0.55$.

* * * * *